US010892776B1

(12) United States Patent
Kuo

(10) Patent No.: US 10,892,776 B1
(45) Date of Patent: Jan. 12, 2021

(54) MEMORY CONTROLLER AND METHOD OF ACCESSING FLASH MEMORY

(71) Applicant: Silicon Motion, Inc., Jhubei (TW)

(72) Inventor: Shiuan-Hao Kuo, New Taipei (TW)

(73) Assignee: SILICON MOTION, INC., Jhubei (TW)

( * ) Notice: Subject to any disclaimer, the term of this patent is extended or adjusted under 35 U.S.C. 154(b) by 0 days.

(21) Appl. No.: 16/835,939

(22) Filed: Mar. 31, 2020

(30) Foreign Application Priority Data

Jan. 14, 2020 (TW) .............................. 109101189 A

(51) Int. Cl.
*H03M 13/11* (2006.01)
*G06F 11/10* (2006.01)

(52) U.S. Cl.
CPC ..... *H03M 13/1108* (2013.01); *G06F 11/1068* (2013.01)

(58) Field of Classification Search
CPC .............................................. H03M 13/1108
USPC .................................. 714/764, 770, 758, 763
See application file for complete search history.

(56) References Cited

U.S. PATENT DOCUMENTS

| 9,496,939 | B2* | 11/2016 | Chen | H04L 1/0606 |
|---|---|---|---|---|
| 2010/0281328 | A1* | 11/2010 | Lakkis | H04L 1/0043 |
| | | | | 714/752 |
| 2016/0179620 | A1* | 6/2016 | Bazarsky | H03M 13/3707 |
| | | | | 714/766 |
| 2017/0141796 | A1* | 5/2017 | Koike-Akino | H03M 13/1154 |
| 2019/0074850 | A1* | 3/2019 | Hsiao | H03M 13/6566 |
| 2019/0097652 | A1* | 3/2019 | Xiong | H03M 13/1148 |

\* cited by examiner

*Primary Examiner* — Fritz Alphonse
(74) *Attorney, Agent, or Firm* — McClure, Qualey & Rodack, LLP

(57) ABSTRACT

A memory controller for use in a data storage device is provided. A low-density parity check (LDPC) process performed by the memory controller includes an initial phase, a decoding phase, and an output phase. The memory controller includes a variable-node circuit and a check-node circuit. During each LDPC decoding iterative operation in the decoding phase: the check-node circuit obtains a codeword difference from the variable-node circuit, and calculates a syndrome according to the codeword difference. The variable-node circuit is configured to: determine a syndrome weight according to the syndrome from the check-node circuit; obtain a previous codeword from a variable-node memory without obtaining a channel value from a channel-value memory; perform bit-flipping on one or more codeword bits in the previous codeword according to the calculated syndrome weight to generate an updated codeword; and subtract the previous codeword from the updated codeword to obtain the codeword difference.

16 Claims, 7 Drawing Sheets

MEMORY CONTROLLER AND METHOD OF ACCESSING FLASH MEMORY

CROSS REFERENCE TO RELATED APPLICATIONS

This Application claims priority of Taiwan Patent Application No. 109101189, file on Jan. 14, 2020, the entirety of which are incorporated by reference herein.

BACKGROUND OF THE INVENTION

Field of the Invention

The present invention relates to data accessing and, in particular, to a memory controller and a method of accessing a flash memory.

Description of the Related Art

With the advent of semiconductor technology, low-density parity check (LDPC) codes have been implemented in very-large-scale integrated (VLSI) circuits in recent years and are widely used in the field of digital communications (e.g., wireless communications and optical-fiber communications) and data transmission (e.g., used in data storage devices such as flash memory and solid-state disks) as error-correction codes.

LDPC decoders use a linear error correcting code with parity bits. Parity bits provide a decoder with parity equations which can validate a received codeword. For example, a low-density parity check is a fixed-length binary code wherein all the symbols added together will equal zero.

During encoding, all data bits are repeated and transmitted to encoders, wherein each encoder generates a parity symbol. Codewords are formed of k information digits and r check digits. If the length of the codeword is n then the information digits, k, will equal n−r. The codewords can be represented by a parity check matrix, which consists of r rows (representing equations) and n columns (representing digits). The codes are called low-density because the parity matrix will have very few '1's in comparison to the number of '0's. During decoding, each parity check is viewed as a single parity check code, and is then cross-checked with others. Decoding occurs at check nodes, and cross-checking occurs at variable nodes.

LDPC engines support three modes: hard decision hard decoding, soft decision hard decoding, and soft decision soft decoding. FIG. 1A is a diagram of a parity-check matrix H. FIG. 1B is a diagram of a Tanner Graph. As depicted in FIG. 1A, each row in the parity-check matrix H may form a check node, such as check nodes C1, C2, C3, and C4. Each column in the parity-check matrix H may form a variable node, such as variable nodes V1, V2, V3, V4, V5, V6, and V7.

The Tanner graph is another way to represent codewords, and can be used to explain some of the operation of the low-density parity check (LDPC) decoder on hard-decision soft decoding when using a bit-flipping algorithm.

As depicted in FIG. 1B, in the Tanner graph, check nodes represented by the square nodes C1 to C4 is the number of parity bits, and the variable nodes represent by the circular nodes V1 to V7 is the number of bits in a codeword. If a particular equation is related to a code symbol, the corresponding check node and variable node are represented by a line. The estimated information is passed along these lines and combined in different ways on the nodes.

When the LDPC decoding is started, the variable node will send an estimate to the check nodes on all lines, where these lines contain the bits that are considered correct. Then, each check node will perform a new estimate for each variable node according to all other connected estimates, and return the new estimated information to the variable node. The new estimation is based on: the parity check equation forces all variable nodes to a specific check node so that the sum is zero.

These variable nodes receive new estimation information and use a majority rule (i.e., a hard decision) to determine whether the value of the transmitted original bit is correct. If the value of the original bit is determined to be incorrect, the original bit will be flipped. The flipped bits are then returned to the check nodes, and the aforementioned steps are performed iteratively a predetermined number of times until the parity-check equation is satisfied (i.e., the value calculated by the check node matches the value received from the variable node), early termination can be enabled, which will cause the system to end the decoding process before the maximum iterative operations are reached.

The parity-check iterative operations are implemented by performing a syndrome check. A valid codeword will fit the equation $H \cdot C^T = S = 0$, where H denotes a parity check matrix; C denotes a hard-decision codeword; and S denotes a syndrome. When S is equal to zero, it indicates that the decoding process is complete and no further information is needed. Generally, hard decisions and syndrome checks are performed during iterative operations. A non-zero syndrome indicates the existence of odd parity, and a new decoding iterative operation is required.

During the decoding phase of a conventional bit-flipping LDPC decoder, the number of 1's is in a great portion of the codeword data, and thus the toggle rate on the data lines of the memory is also very high, resulting in high power consumption of the conventional bit-flipping LDPC decoder.

BRIEF SUMMARY OF THE INVENTION

Accordingly, a memory controller and a method of accessing a flash memory are provided in the invention. The memory controller and the method are capable of alternating the data-control flow in the VNU and CNU of the decoder during the decoding phase, and performing iterative operations on the error pattern. Thus, the ratio of 1's in the codeword accessed by the VNU can be greatly reduced, thereby significantly reducing the toggle rate on the data lines and reducing the power consumption of the decoder. In addition, it is not necessary to access the channel value stored in the channel-value memory during the decoding phase, and thus power consumption can be reduced further.

In an exemplary embodiment, a memory controller for use in a data storage device is provided. A low-density parity check (LDPC) process performed by the memory controller includes an initial phase, a decoding phase, and an output phase. The memory controller includes a variable-node circuit and a check-node circuit. During each LDPC decoding iterative operation in the decoding phase: the check-node circuit obtains a codeword difference from the variable-node circuit, and calculates a syndrome according to the codeword difference. The variable-node circuit is configured to: determine a syndrome weight according to the syndrome from the check-node circuit; obtain a previous codeword, that is generated in a previous LDPC iterative operation, from a variable-node memory without obtaining a channel value, that is read from a flash memory of the data storage device, from a channel-value memory; perform bit-flipping on one or more codeword bits in the previous codeword according to the calculated syndrome weight to generate an updated codeword; and subtract the previous codeword from the updated codeword to obtain the codeword difference.

In some embodiments, during the initial phase, the variable-node circuit obtains the channel value, that is read from the flash memory, from the channel-value memory, and transmits the channel value to the check-node circuit to calculate the syndrome.

In some embodiments, a randomizer of the data storage device randomizes host data from a host to generate random data, and an LDPC encoder in the data storage device encodes the random data to generate a corresponding check code, and stores the random data and the corresponding check code in the flash memory. In addition, the channel value read from the flash memory comprises the random data and the corresponding check code.

In some embodiments, during the initial phase, in response to the syndrome not being equal to 0, the variable-node circuit sets an updated codeword to 0 and writes the updated codeword to the variable-node memory. The updated codeword and the previous codeword in the decoding phase are an updated error codeword and a previous error codeword, respectively.

In some embodiments, during the decoding phase, in response to the variable-node circuit determining that the syndrome is equal to 0 or an upper limit of iterative operations has been reached, the variable-node circuit finishes the decoding phase to enter the output phase.

In some embodiments, during the output phase, the memory controller outputs the updated codeword stored in the variable-node memory as a variable-node sign value, sets the variable-node sign value to an error value, and adds the variable-node sign value and the channel value to obtain a decoding result.

In another exemplary embodiment, a method of accessing a flash memory for use in a memory controller of a data storage device is provided. A low-density parity check (LDPC) process performed by the memory controller comprises an initial phase, a decoding phase, and an output phase. The method includes the following steps: storing data to the flash memory of the data storage device via a storage procedure; during each LDPC decoding iterative operation in the decoding phase: obtaining a codeword difference, and calculating a syndrome according to the codeword difference; determining a syndrome weight according to the syndrome; obtaining a previous codeword, that is generated in a previous LDPC iterative operation, from a variable-node memory without obtaining a channel value, that is read from a flash memory of the data storage device, from a channel-value memory; performing bit-flipping on one or more codeword bits in the previous codeword according to the calculated syndrome weight to generate an updated codeword; and subtracting the previous codeword from the updated codeword to obtain the codeword difference.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 2:
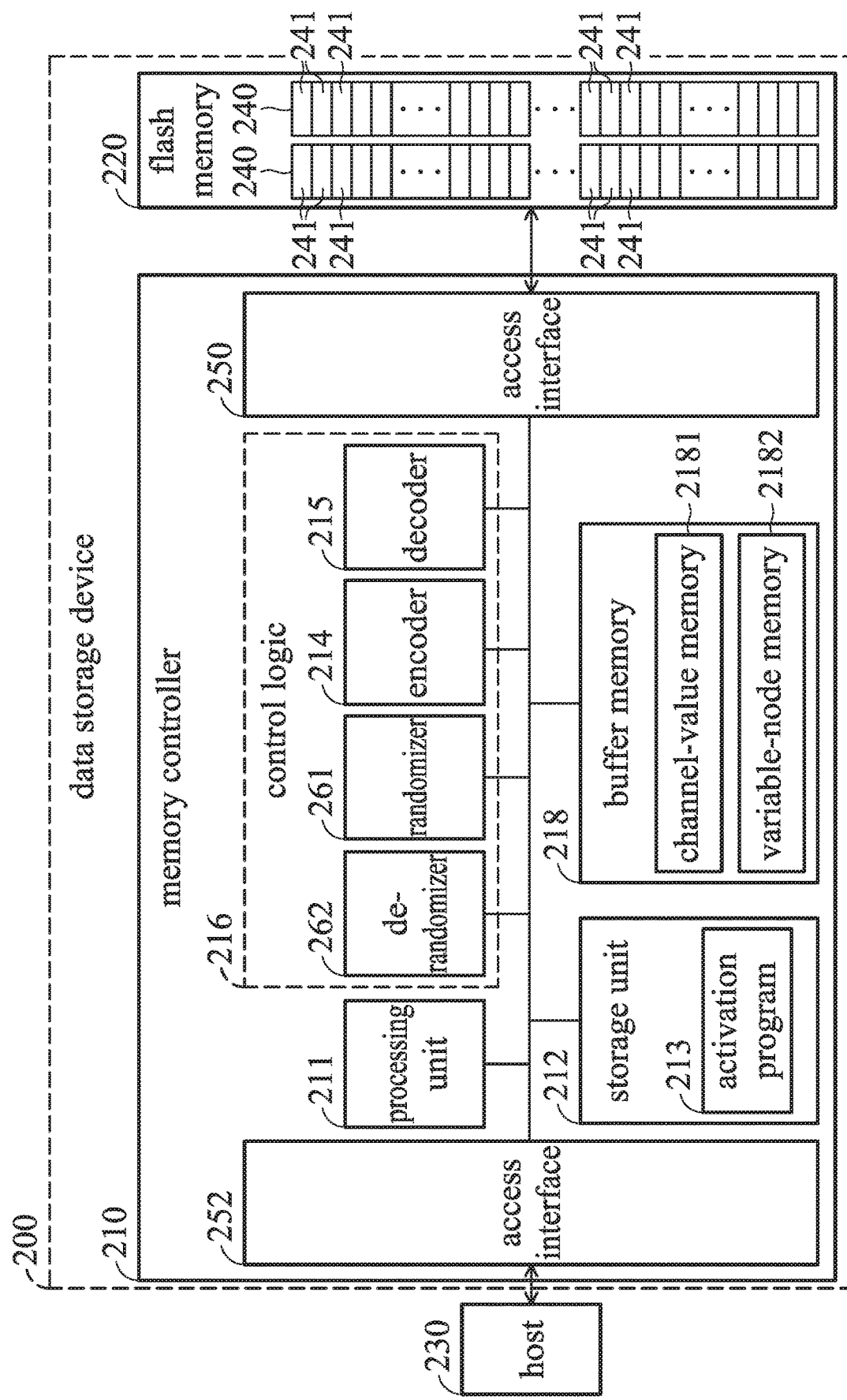
FIG. 2 is a block diagram of a data storage device in accordance with an embodiment of the invention.

FIG. 2 is a block diagram of a data storage device in accordance with an embodiment of the invention.

In an embodiment, the data storage device 200 may be a portable memory device (E.g., a memory card compatible with SD/MMC, CF, MS, XD standards) or a solid-state disk (SSD), and host 230 may be an electronic device, such as a mobile phone, a laptop computer, a desktop computer, etc., that is connected to the data storage device 200. In another embodiment, the data storage device 200 can be disposed in an electronic device such as a mobile phone, a laptop computer, or a desktop computer. At this time, the host device 230 may be a processor of the electronic device.

As depicted in FIG. 2, the data storage device 200 may include a memory controller 210 and a flash memory 220, wherein the memory controller 210 may be configured to access the flash memory 200. In an embodiment, the memory controller 210 may include a processing unit 211, a storage unit 212, a control logic 216, a buffer memory 218, and access interfaces 250 and 252. The processing unit 211 may be implemented by dedicated hardware circuits or general-purpose hardware, a processor with multiple processing cores, or a multi-processor with parallel processing capabilities, and the foregoing manner of implementation may, for example, be a general-purpose processor, or a microcontroller, but the invention is not limited thereto.

The storage unit 212 may be a non-volatile memory, such as a read-only memory (ROM), an erasable programmable read-only memory (EPROM), an electrically erasable programmable read-only memory (EEPROM), or an E-fuse. The storage unit 2121 stores an activation program that includes a boot code or a bootloader, and can be executed by the processing unit 211. The memory controller 210 completes the booting based on the activation program 213 and starts to control operations of the flash memory, such as reading an in-system programming (ISP) code.

The flash memory 220 may be a NAND flash memory, and may include a plurality of physical blocks 240, and each physical block may include a plurality of physical pages 241.

In the data storage device 200, several electrical signals are used for coordinating commands and data transfer between the processing unit 211 and the flash memory 220, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc.

The access interface 250 may communicate with the flash memory 220 using a SDR (Single Data Rate) protocol or a DDR (Double Data Rate) protocol, such as ONFI (open NAND flash interface), DDR toggle, or others. The processing unit 211 may communicate with the host 230 through an access interface 252 using a designated communication protocol, such as USB (Universal Serial Bus), ATA (Advanced Technology Attachment), SATA (Serial ATA), PCI-E (Peripheral Component Interconnect Express), NVME (Non-volatile Memory Express), or others.

The buffer memory 218 may be a volatile memory such as a dynamic random access memory (DRAM) and/or a static random access memory (SRAM). In the embodiment, the buffer memory 218 may include a channel-value memory (CHVMem) 2181, and a variable-node memory (VNMem) 2182. The channel-value memory 2181 is configured to temporarily store the original page data (i.e., can be regarded as codewords) from the flash memory 220 via the access interface 250, or temporarily store the host commands from the host 230. The variable-node memory 2182 is configured to temporarily store the variable node data of each variable node in the decoding process for low-density parity checking. In addition, the codewords stored in the channel-value memory 2181 may be information read by the flash memory 220 in a hard or soft decision. A hard decision uses a single read voltage threshold, so the resulting codeword has only sign information. A soft decision uses multiple read voltage thresholds, so the obtained codeword also carries reliability information in addition to sign information. For example, each codeword bit can be expressed by the reliability information of at least one bit. If the reliability information is expressed as a single bit, 0 and 1 can be used to indicate two different reliability levels such as strong and weak. The codeword bit used together with the reliability information can be classified into four different levels of strong "1", weak "1", weak "0", and strong "0".

The control logic 216 may include an encoder 214 and a decoder 215. In some embodiments, the encoder 214, decoder 215, a randomizer 261, and a de-randomizer 262. In some embodiments, the encoder 214, decoder 215, randomizer 261, de-randomizer 262, and the control logic 216 are hardware circuits, and they can be implemented by application-specific integrated circuits (ASICs), field-programmable gate arrays (FPGAs), complex programmable logic device (CPLD), or logic circuits with the same function, but the invention is not limited thereto.

Figure 3:
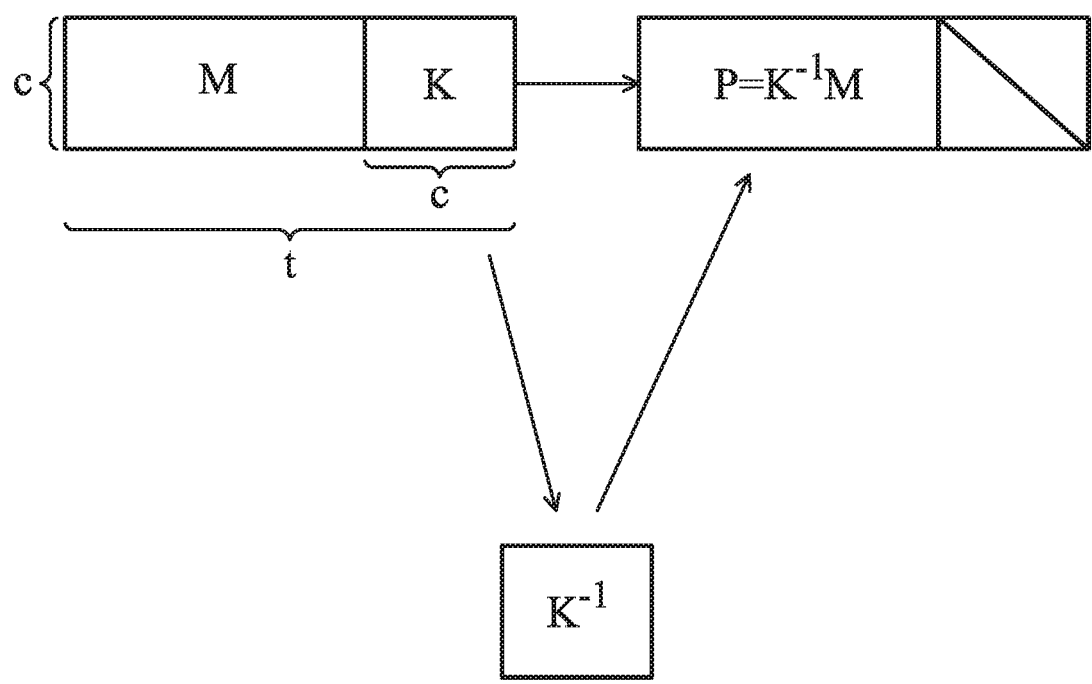
FIG. 3 is a diagram of a check-node check matrix and a check-code generation matrix.

In an embodiment, the randomizer 261 can be disposed in front of the encoder (i.e., the host-side) in the encoding procedure. For example, the data from the host 230 will first pass through the randomizer 261 to generate random data, where the ratio of the numbers of 0's and 1's in the random data is about 50%: 50%, and that is, 0's and 1's in the random data are substantially half, so as to improve the wear leveling of the flash memory 220. The encoder 214 may be an LDPC encoder that is configured to generate a corresponding check code according to the random data from the randomizer 261, and the generated check code conforms to a check-code check matrix. Specifically, referring to FIG. 3, it is assumed that the check-code check matrix is a matrix of size c*t (e.g., the number of rows c=5, and the number of columns t=48), and the check-code check matrix can be divided into a left-side matrix M of size c*(t−c) and a right-side matrix K of size c*c. In order to find the check-code generation matrix corresponding to the check-code check matrix, the inverse matrix $K^{-1}$ of the matrix K can be found first, and the inverse matrix $K^{-1}$ is the multiplied by the matrix M to obtain the matrix P. The transpose matrix of the matrix P can be used as the check-code generation matrix. In other words, after finding the transpose matrix of the matrix P, the encoder 214 can multiply the random data from the randomizer 261 by the transpose matrix of the matrix P to obtain the check code corresponding to the random data, and then the random data and the check code are multiplied by the check-code check matrix to determine whether the check code is correct. For example, if the multiplication result is equal to "0", it is determined that the encoding is correct. If the multiplication result is not equal to "0", it is determined that the encoding is incorrect. After the encoding is determined to be correct, the data and the corresponding check code will be written to one of the physical pages of the flash memory 220.

In the embodiment, the order of the decoder 215 and the de-randomizer 262 in the decoding process is relative to the order of the randomizer 261 and the encoder 214 in the encoding process. That is, the channel value read from the flash memory 220 will first pass through the decoder 215 and then pass through the de-randomizer 262. In some embodiments, the randomizer 261 and de-randomizer 262 can be regarded as a scrambler and a descrambler, respectively.

The decoder 215, for example, may be an LDPC decoder. When the host 230 sends a read command to the data storage device 230, the memory controller 210 obtains the initial page data from the flash memory 220, such as the channel value. In the embodiments, since the channel value read from the flash memory 220 has not been de-randomized by the de-randomizer 262, it indicates that the ratio of the numbers of 1's and 0's are substantially 50%:50%. For example, the channel value may include initial random data and error-correction code data. Because the initial random data and the error-correction code data may have errors when being transmitted through the channel, the decoder 215 may use the error-correction code data to perform error correction on the initial data and/or the error-correction code data, such as using a bit-flipping algorithm to perform LDPC decoding. Accordingly, the decoding result generated by the decoder 215 can be regarded as the correct random data that is input to the encoder 214, and the random data is de-randomized by the de-randomizer 262 to obtain original page data.

In another embodiment, the arrangement of the encoder 214 and randomizer 261 in the encoding process, and the decoder 215 and de-randomizer 262 in the decoding process is slightly different from that in the aforementioned embodiment. For example, the randomizer 215 and de-randomizer 216 can be disposed at the flash-memory side. In the encoding process, the data from the host 230 will first be encoded by the encoder 214 to generate a corresponding check code, and the data and its corresponding check code will pass through the randomizer 261 to generate random data that is written to the flash memory 220. In the decoding process, the channel value read from the flash memory 220 will first be de-randomized by the de-randomizer 262 to obtain the original data and its corresponding check code. Then, the decoder 215 performs LDPC decoding on the original and corresponding check code generated by the de-randomizer 262, thereby obtaining error-corrected data.

It should be noted that no matter whether the randomizer 261 and the de-randomizer 262 are disposed on the host side or the flash-memory side, the LDPC decoding method provided in the present invention can be used.

Figure 4:
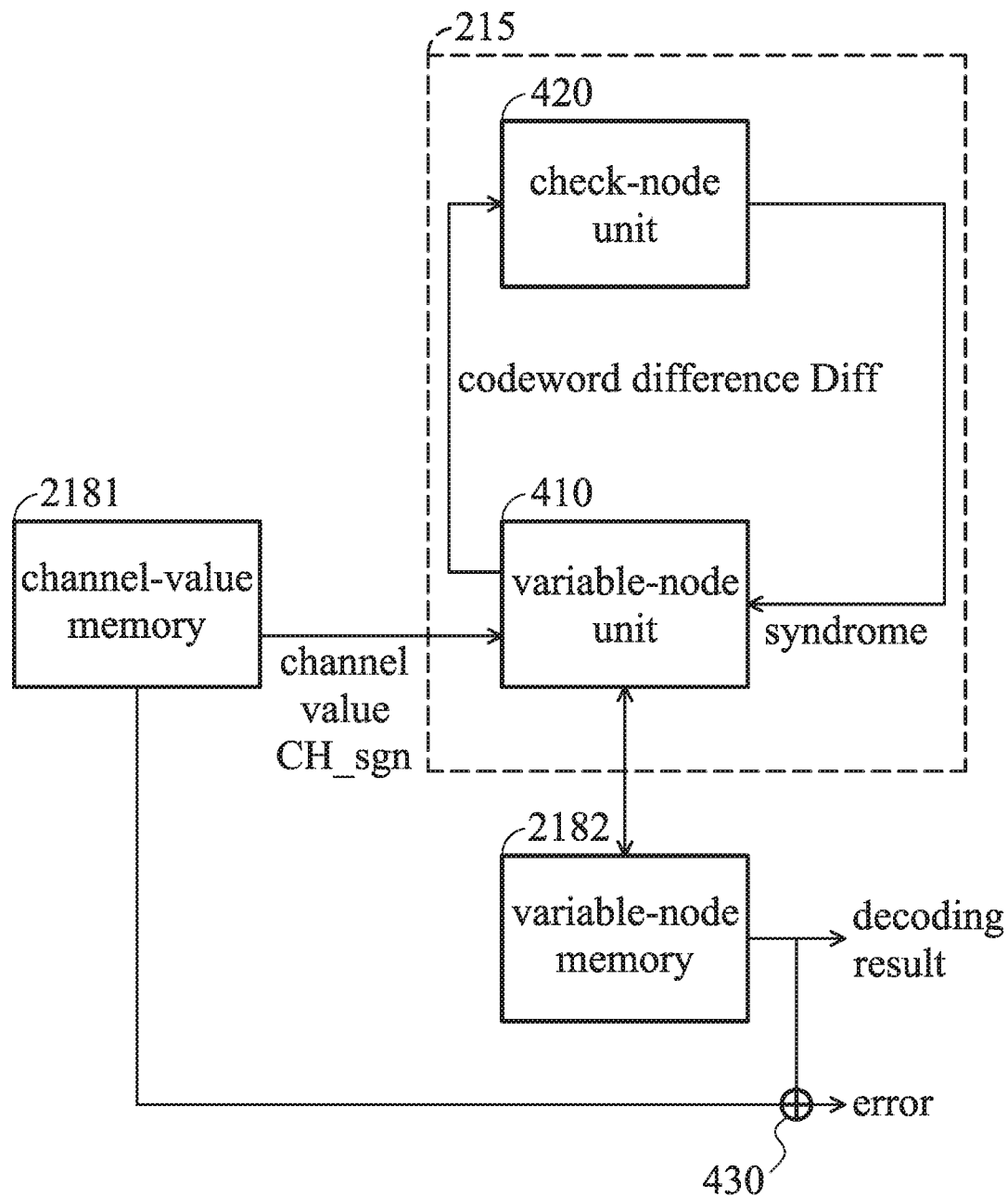
FIG. 4 is a block diagram of the decoder in accordance with a first embodiment of the invention.

FIG. 4 is a block diagram of the decoder 215 in accordance with a first embodiment of the invention. As depicted in FIG. 4, the decoder 215 may include a variable-node unit (VNU) 410 and a check-node unit (CNU) 420. The data flow in the decoder 215 can be divided into three phases such as an initial phase, a decoding phase, and an output phase.

In the first embodiment, in the initial phase, the decoder 215 starts LDPC decoding, and the VNU 410 resets the previous codeword temporarily stored in the variable-node memory 2182. The initial phase can be regarded as the first iterative operation, and the VNU 410 may obtain a channel value CH_sgn from the channel-value memory 2181, and bypass the channel value CH_sgn to the CNU 420. For example, the channel value may be original page data read from the flash memory 220 using hard decision or soft decision.

Figures 1A, 1B:
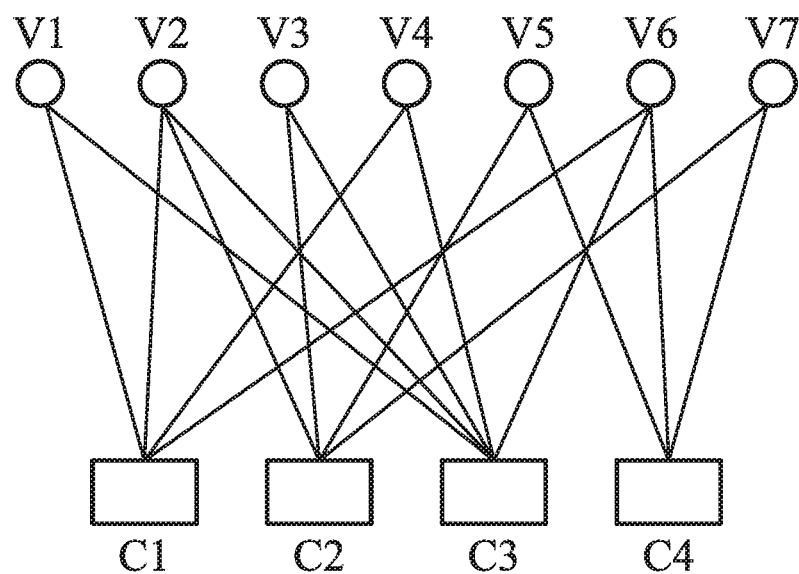
FIG. 1A is a diagram of a parity-check matrix.
FIG. 1B is a diagram of a Tanner graph.

The CNU 420 may calculate a syndrome of the first iterative operation using the initial channel value, that is, the CNU 420 may first calculate the check nodes C1 to C4 in the horizontal row shown in FIG. 1A. The CNU 420 may then transmit the calculated syndrome to the VNU 410. The VNU 410 may determine whether to perform calculations of subsequent variable nodes according to the syndrome from the CNU 420. If the syndrome is equal to 0, the VNU 410 may determine that the calculations of subsequent variable nodes are not necessary, and finish the initial phase to enter the output phase. If the syndrome is not equal to 0, the VNU 410 may calculate a syndrome weight according to the syndrome from the VNU 420 and the channel value CH_sgn, and perform a bit-flipping algorithm to determine whether one or more codeword bits in the channel value CH_sgn should be bit-flipped according to the calculated syndrome weight, wherein the aforementioned bit-flipping algorithm can be implemented using know techniques in the field of the present invention, and thus its details are not described here.

Afterwards, the VNU 410 may store the updated codeword VN_new, that is generated by performing bit-flipping on the channel value, in the variable-node memory 2182 for use by subsequent iterative operations. At this time, the initial phase of the LDPC decoding ends, and the decoding phase starts.

In the decoding phase, the VNU 410 and CNU 420 of the decoder 215 will continue to iterate until the syndrome generated by the CNU 420 is equal to 0 or an upper limit of iterative operations has been reached. For example, during each iterative operation, the VNU 410 will obtain the channel value CH_sgn and previous codeword VN_prev respectively from the channel-value memory 2181 and variable-node memory 2182, where the previous codeword VN_prev in the current iterative operation is the updated codeword VN_new generated in previous iterative operation and stored in the variable-node memory 2182. The VNU 410 may calculate a syndrome weight according to the syndrome from CNU 420 and the channel value CH_sgn, and perform a bit-flipping algorithm to determine whether one or more codeword bits in the channel value CH_sgn should be bit-flipped according to the calculated syndrome weight. Then, the VNU 410 may store the updated codeword VN_new, that is generated by bit-flipping the channel value, to the variable-node memory 2182 for subsequent iterative operations. The VNU 410 may calculate the difference value Diff between the updated codeword VN_new and previous codeword VN_prev, and transmit the difference value Diff to the CNU 420 for performing corresponding operations on the syndrome. When the syndrome generated by a specific iterative operation in the decoding phase is equal to 0 or the upper limit of iterative operations has been reached, the decoding phase ends and the output phase starts.

In the output phase, the decoder 215 may output the updated codeword VN_new stored in the VNU 410 as the decoding result. In addition, the updated codeword VN_new and the channel value 430 are transmitted to an adder 430 to obtain the difference between the decoding result and the channel value. For example, the difference between the decoding result and channel value can be used obtain the number of error bits in the channel value, and thus the number of error bits can be used to determine the current health status of the flash memory 220.

Figure 5:
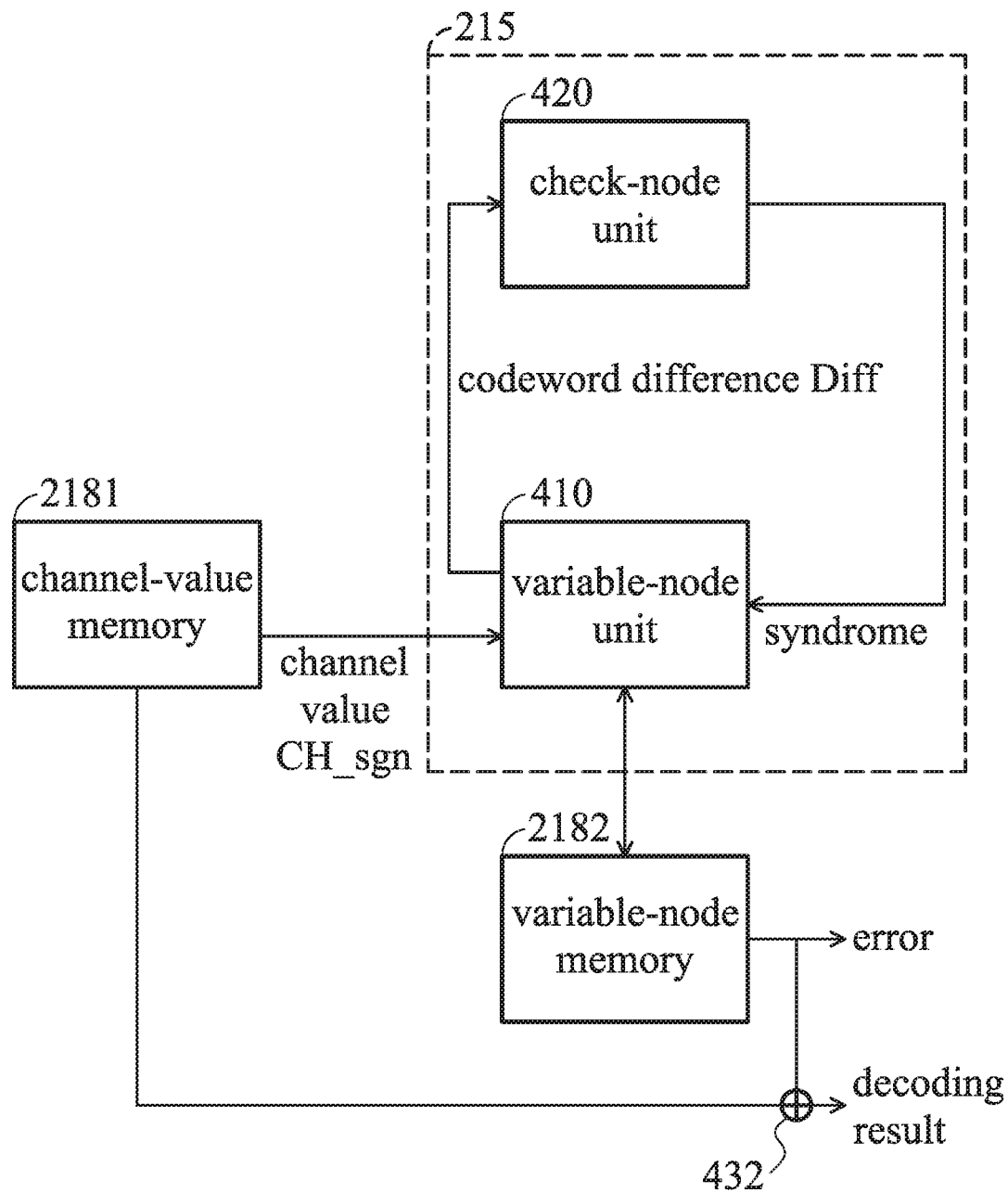
FIG. 5 is a block diagram of the decoder in accordance with a second embodiment of the invention.

FIG. 5 is a block diagram of the decoder 215 in accordance with a second embodiment of the invention. In the second embodiment, the functions of the VNU 410 and CNU 420 in FIG. 5 are the same as those in FIG. 4, but the data-control flow in FIG. 5 is difference from that in FIG. 4.

For example, in the initial phase, the decoder 215 starts LDPC decoding, and the VNU 410 resets the previous codeword temporarily stored in the variable-node memory 2182. The initial phase can be regarded as the first iterative operation, and the VNU 410 may obtain a channel value CH_sgn from the channel-value memory 2181, and bypass the channel value CH_sgn to the CNU 420.

The CNU 420 may calculate a syndrome of the first iterative operation using the initial channel value, and transmit the calculated syndrome to the VNU 410. The VNU 410 may determine whether to perform calculations of subsequent variable nodes according to the syndrome from the CNU 420. If the syndrome is equal to 0, the VNU 410 may determine that the calculations of subsequent variable nodes are not necessary, and finish the initial phase to enter the output phase. If the syndrome is not equal to 0, the VNU 410 may directly set the updated codeword VN_new to 0 and write the updated codeword VN_new to the variable-node memory 2182, and finish the initial phase to enter the decoding phase.

In the decoding phase, the VNU 410 and CNU 420 of the decoder 215 will continue to iterate until the syndrome generated by the CNU 420 is equal to 0 or an upper limit of iterative operations has been reached. However, the difference between the embodiments of FIG. 5 and FIG. 4 is that, during each iterative operation in the decoding phase in FIG. 5, the VNU 410 may obtain the previous codeword VN_prev from the variable-node memory 2182 without obtaining the channel value CH_sgn from the channel-value memory 2181. Thus, the channel-value memory 2181 can be turned off to reduce power consumption in the decoding phase.

The VNU 410 may calculate a syndrome weight according to the syndrome from CNU 420, and perform a bit-flipping algorithm to determine whether one or more codeword bits in the channel value CH_sgn should be bit-flipped according to the calculated syndrome weight. Then, the VNU 410 may store the updated codeword VN_new, that is generated by bit-flipping the previous codeword VN_prev, to the variable-node memory 2182 for subsequent iterative operations. The VNU 410 may calculate the difference value Diff between the updated codeword VN_new and previous codeword VN_prev, and transmit the difference value Diff to the CNU 420 for performing corresponding operations on the syndrome. When the syndrome generated by a specific iterative operation in the decoding phase is equal to 0 or the upper limit of iterative operations has been reached, the decoding phase ends and the output phase starts.

In the output phase, the decoder 215 may output the updated codeword VN_new stored in the variable-node memory 2182 as a variable-node sign value VN_sgn, and add the variable-node sign value VN_sgn with the channel value CH_sgn to obtain the decoding result. Because the updated codeword VN_new stored in the variable-node memory 2182 is the result obtained from various iterations of the noise e, the variable-node sign value VN_sgn can be regarded as a difference value that can be used obtain the number of error bits in the channel value. Thus, the number of error bits can be used to determine the current health status of the flash memory 220.

Specifically, in the decoding phase in the embodiment of FIG. 5, the VNU 410, for example, performs operations on the codeword difference, but the in the end, the same decoding result as the decoding process in FIG. 4 can still be obtained. The aforementioned phenomenon can be deduced from the mathematical formula of the LDPC algorithm.

For example, since the LDPC algorithm uses linear block codes, the result of adding two different codewords can obtain another codeword. Accordingly, the channel value y read from the flash memory 220 can be regarded as the result of adding the correct codeword c and the noise e, and the calculation can be expressed by formula (1):

$$y = c \oplus e \quad (1)$$

The syndrome S can be obtained using the inner product of the parity-check matrix and the channel value y, where the calculation can be expressed by formula (2):

$$H \cdot y^T = S^T \quad (2)$$

Substituting formula (1) into formula (2), formula (3) can be obtained as follows:

$$H \cdot (c^T \oplus e^T) = S^T \quad (3)$$

After expanding formula (3), formula (4) can be obtained as follows:

$$H \cdot c^T + H \cdot e^T = S^T \quad (4)$$

If the correct codeword is set to 0, the inner product of the parity-check matrix H and the correct codeword c must be 0, and thus formula (4) can be rewritten as formula (5):

$$H \cdot e^T = S^T \quad (5)$$

That is, when the correct codeword is set to 0, the syndrome S obtained by each iterative operation of LDPC decoding is only related to the noise e, where the noise e can be regarded as error-codeword bits.

For example, setting the correct codeword c in formula (4) to 0 may correspond to the initial stage in the embodiment of FIG. 5, and the VNU may directly set the updated codeword VN_new to 0 and write the updated codeword VN_new to the variable-node memory 2182. It should be noted that since the data written to the flash memory 220 is the encoded random data that is obtained by first processing the data from the host by the randomizer 261 and then encoded by the encoder 214. Thus, in the decoding process, the codeword obtained by the decoder 215 can be regarded as high-density and high-weight data with substantially 50% of 1's and 50% of 0's.

In the decoding phase in the embodiment of FIG. 4, the content accessed from the variable-node memory 2182 may include codewords with substantially 50% of 1's and 50% of 0's, and thus the toggle rate on the data lines of the variable-node memory 2182 is also very high, for example, it can be considered as 50%.

When the data-control flow in the embodiment of FIG. 5 is used, the content accessed from the variable-node memory 2182 may be error patterns. Since the raw-bit error rate (RBER) of a normal flash memory 220 is less than about 1%, the proportion of 1's in the error pattern is also less than about 1%. Accordingly, the toggle rate of the variable-node memory 2182 in FIG. 5 can be reduced to less than 1% from 50% in the embodiment of FIG. 4, thereby significantly reducing the power consumption of the decoder 214. In addition, the channel-value memory 2181 is not accessed during the decoding stage in the embodiment of FIG. 5, so the toggle rate on the data lines of the channel-value memory 2181 is 0, thereby further reducing the power consumption of the decoder 214.

The calculation process of formula (5) may correspond to the decoding stage in the embodiment of FIG. 5. That is, the noise e is calculated in each iterative operation of LDPC decoding. When the decoding phase ends, the codeword result (e.g., variable-node sign value VN_sgn) stored in the variable-node memory 2182 is the error value, and the decoding result can be obtained by adding the variable-node sign value VN_sgn and the channel value CH_sgn.

Figure 6A:
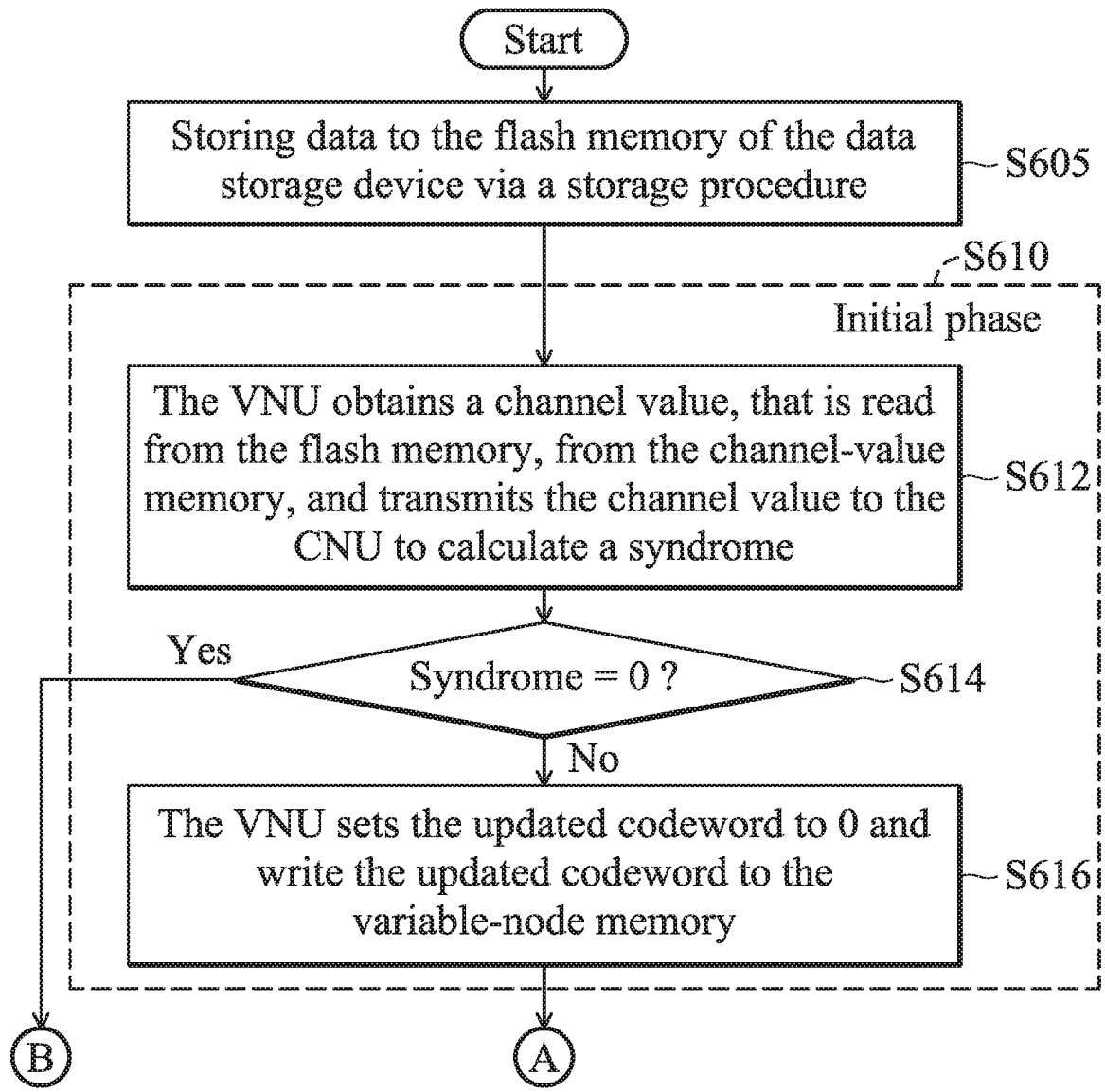
FIGS. 6A and 6B are portions of a flow chart of a method of accessing a flash memory in accordance with an embodiment of the invention.
Figure 6B:
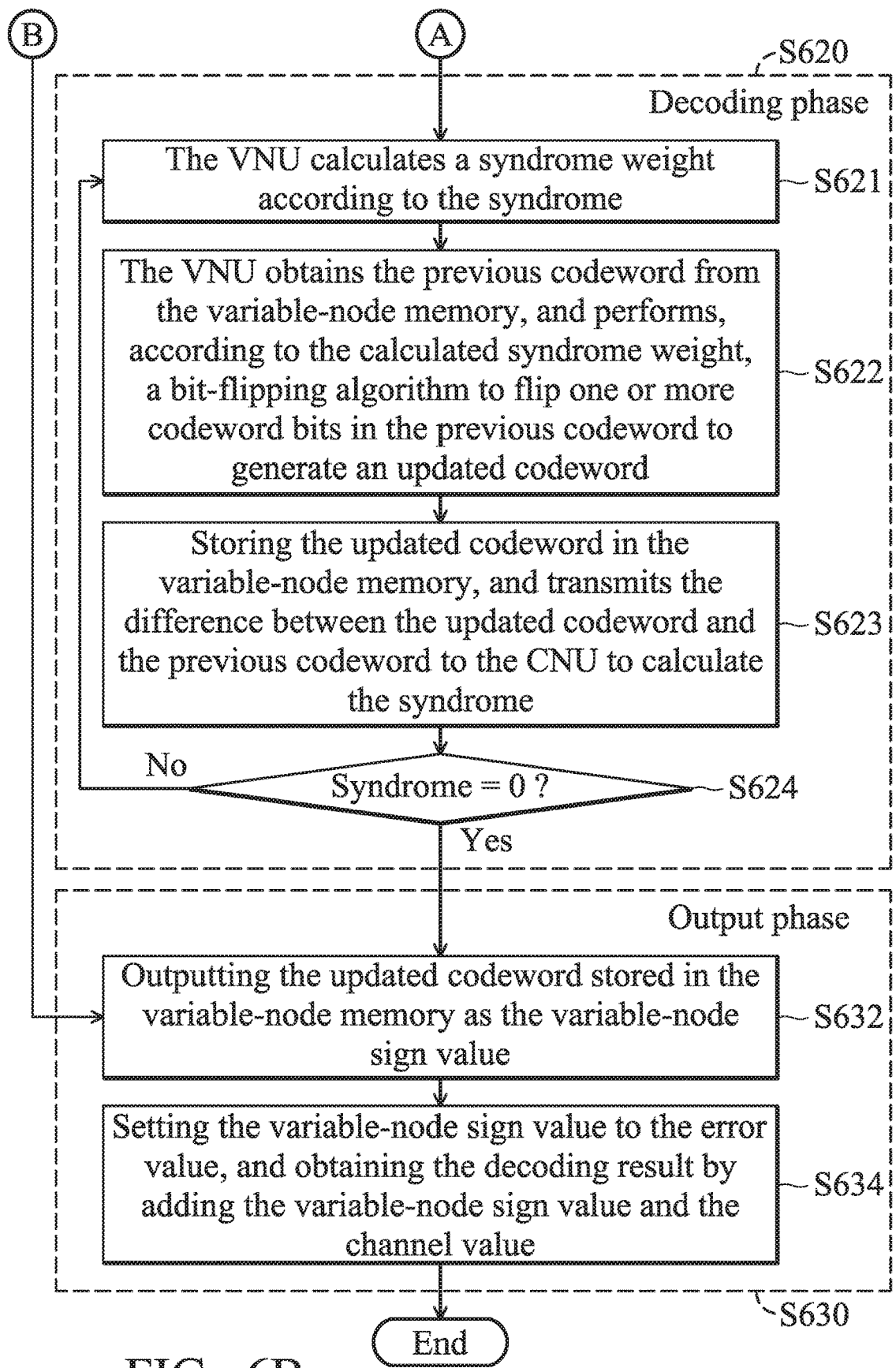

FIGS. 6A and 6B are portions of a flow chart of a method of accessing a flash memory in accordance with an embodiment of the invention. Referring FIG. 2, FIG. 5, FIGS. 6A and 6B, the data-reading process of the flash memory 220 may include the LDPC decoding process, and the LDPC decoding process may include the initial phase S610, the decoding phase S620, and the output phase S630. In step S605, data is stored to the flash memory 220 of the data storage device 200 via a storage procedure. For example, the storage procedure may process the data that the host wants to store to the data storage device 200 via an encoding process (e.g., LDPC encoding), and write the encoded data to the flash memory 220.

Initial Phase S610

In step S612, the VNU 410 obtains a channel value, that is read from the flash memory 220, from the channel-value memory 2181, and transmits the channel value to the CNU 420 to calculate a syndrome. Because it is the first iterative operation in the LDPC decoding process, the VNU 410 needs to bypass the channel value to the CNU 420 to calculate the syndrome.

In step S614, the VNU 410 determines whether the syndrome is equal to 0. If the syndrome is equal to 0, the process directly proceeds to step S632 in the output phase S630. If the syndrome is not equal to 0, step S616 is performed. For example, if the syndrome is equal to 0, it indicates that there is no error in the channel value, so the initial phase S610 can be directly ended and output phase S630 can be entered. If the syndrome is not equal to 0, it indicates that there is an error in the channel value, so a subsequent decoding phase S620 is required.

In step S616, the VNU 410 sets the updated codeword to 0 and write the updated codeword to the variable-node memory 2182. The details for setting the updated codeword to 0 can be referred to in the embodiments of formulas (4) and (5).

Decoding Phase S620

In step S621, the VNU 410 calculates a syndrome weight according to the syndrome.

In step S622, the VNU 410 obtains the previous codeword from the variable-node memory 2182, and performs, according to the calculated syndrome weight, a bit-flipping algorithm to flip one or more codeword bits in the previous codeword to generate an updated codeword. Since the initial updated has been set to 0 in the initial phase, the previous codeword in this step can be regarded as the error codeword, and the iterative operations are performed for the error pattern. It should be noted that in step S622, the VNU 410 does not need to read the channel value from the channel-value memory 2181 again.

In step S623, the VNU 410 stores the updated codeword in the variable-node memory 2182, and transmits the difference Diff between the updated codeword and the previous codeword to the CNU 420 to calculate the syndrome. Similarly, the updated codeword in this step can also be regarded as the updated error codeword, and the iterative operations are performed for the error pattern.

In step S624, the VNU 410 determines whether the syndrome is equal to 0. If the syndrome is equal to 0, the decoding phase S620 ends to enter step S632 in the output phase S630. If the syndrome is not equal to 0, it indicates that the iterative operations are still required, and the process goes back to step S621. In addition, in this step, the VNU 410 can further determine whether the upper limit of the iterative operations has been reached. If the upper limit of the iterative operations has been reached, the decoding phase S620 ends to enter step S632 in the output phase S630. If the upper limit of the iterative operations has not been reached yet, the flow goes back to step S621.

Output Phase S630

In step S632, the updated codeword stored in the variable-node memory 2182 is output as the variable-node sign value VN_sgn.

In step S634, the decoder 215 sets the variable-node sign value VN_sgn to the error value, and obtains the decoding result by adding the variable-node sign value and the channel value. In the embodiment of FIGS. 6A and 6B, the noise/error value is calculated during the decoding phase, the result of the decoding phase is the actual error value corresponding to the correct codeword. In addition, the error value in the channel value CH_sgn can be eliminated to obtain the correct decoding result (i.e., error-corrected codeword) by adding the variable-node sign value and the channel value.

In view of the above, a memory controller and a method of accessing a flash memory are provided in the invention. The memory controller and the method are capable of alternating the data-control flow in the VNU and CNU of the decoder during the decoding phase, and performing iterative operations on the error pattern. Thus, the ratio of 1's in the codeword accessed by the VNU can be greatly reduced, thereby significantly reducing the toggle rate on the data lines and reducing the power consumption of the decoder. In addition, it is not necessary to access the channel value stored in the channel-value memory during the decoding phase, and thus power consumption can be reduced even further.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory controller, for use in a data storage device, wherein a low-density parity check (LDPC) process performed by the memory controller comprises an initial phase, a decoding phase, and an output phase, the memory controller comprising:

a variable-node circuit; and a check-node circuit, wherein during each LDPC decoding iterative operation in the decoding phase:

the check-node circuit obtains a codeword difference from the variable-node circuit, and calculates a syndrome according to the codeword difference, and the variable-node circuit is configured to:

determine a syndrome weight according to the syndrome from the check-node circuit;

obtain a previous codeword, that is generated in a previous LDPC iterative operation, from a variable-node memory without obtaining a channel value, that is read from a flash memory of the data storage device, from a channel-value memory;

perform bit-flipping on one or more codeword bits in the previous codeword according to the calculated syndrome weight to generate an updated codeword; and subtract the previous codeword from the updated codeword to obtain the codeword difference.

2. The memory controller as claimed in claim 1, wherein during the initial phase, the variable-node circuit obtains the channel value, that is read from the flash memory, from the channel-value memory, and transmits the channel value to the check-node circuit for calculating the syndrome.

3. The memory controller as claimed in claim 2, wherein a randomizer of the data storage device randomizes host data from a host to generate random data, and an LDPC encoder in the data storage device encodes the random data to generate a corresponding check code, and stores the random data and the corresponding check code in the flash memory.

4. The memory controller as claimed in claim 3, wherein the channel value read from the flash memory comprises the random data and the corresponding check code.

5. The memory controller as claimed in claim 2, wherein during the initial phase, in response to the syndrome not being equal to 0, the variable-node circuit sets an updated codeword to 0 and writes the updated codeword to the variable-node memory.

6. The memory controller as claimed in claim 1, wherein the updated codeword and the previous codeword in the decoding phase are an updated error codeword and a previous error codeword, respectively.

7. The memory controller as claimed in claim 1, wherein during the decoding phase, in response to the variable-node circuit determining that the syndrome is equal to 0 or an upper limit of iterative operations has been reached, the variable-node circuit finishes the decoding phase to enter the output phase.

8. The memory controller as claimed in claim 7, wherein during the output phase, the memory controller outputs the updated codeword stored in the variable-node memory as a variable-node sign value, sets the variable-node sign value to an error value, and adds the variable-node sign value and the channel value to obtain a decoding result.

9. A method of accessing a flash memory, for use in a memory controller of a data storage device, wherein a low-density parity check (LDPC) process performed by the memory controller comprises an initial phase, a decoding phase, and an output phase, the method comprising:

storing data to the flash memory of the data storage device via a storage procedure;

during each LDPC decoding iterative operation in the decoding phase:

obtaining a codeword difference, and calculating a syndrome according to the codeword difference;

determining a syndrome weight according to the syndrome;

obtaining a previous codeword, that is generated in a previous LDPC iterative operation, from a variable-node memory without obtaining a channel value, that is read from a flash memory of the data storage device, from a channel-value memory;

performing bit-flipping on one or more codeword bits in the previous codeword according to the calculated syndrome weight to generate an updated codeword; and subtracting the previous codeword from the updated codeword to obtain the codeword difference.

10. The method as claimed in claim 9, further comprising:

during the initial phase, obtaining the channel value, that is read from the flash memory, from the channel-value memory, and calculating the syndrome according to the channel value.

11. The method as claimed in claim 10, further comprising:

utilizing a randomizer of the data storage device to randomize host data from a host to generate random data; and utilizing an LDPC encoder in the data storage device to encode the random data to generate a corresponding check code, and to store the random data and the corresponding check code in the flash memory.

12. The method as claimed in claim 11, wherein the channel value read from the flash memory comprises the random data and the corresponding check code.

13. The method as claimed in claim 10, further comprising:

during the initial phase, in response to the syndrome not being equal to 0, setting an updated codeword to 0 and writing the updated codeword to the variable-node memory.

14. The method as claimed in claim 10, wherein the updated codeword and the previous codeword in the decoding phase are an updated error codeword and a previous error codeword, respectively.

15. The method as claimed in claim 10, further comprising:

during the decoding phase, in response to the syndrome being equal to 0 or an upper limit of iterative operations having been reached, finishing the decoding phase to enter the output phase.

16. The method as claimed in claim 15, further comprising:

during the output phase, performing the following steps:

outputting the updated codeword stored in the variable-node memory as a variable-node sign value; and setting the variable-node sign value to an error value, and adding the variable-node sign value and the channel value to obtain a decoding result.

\* \* \* \* \*